US012670958B2

(12) United States Patent
Yun et al.

(10) Patent No.: US 12,670,958 B2
(45) Date of Patent: Jun. 30, 2026

(54) EXECUTION OF PROLOGUE SUB-OPERATIONS OF A PROGRAMMING OPERATION DURING DATA LOADING

(71) Applicant: Micron Technology, Inc., Boise, ID (US)

(72) Inventors: Hojung Yun, San Jose, CA (US); Xiaoxiao Zhang, San Jose, CA (US); Yizhou Zhu, Fremont, CA (US); Dheeraj Srinivasan, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 142 days.

(21) Appl. No.: 18/388,930

(22) Filed: Nov. 13, 2023

(65) Prior Publication Data

US 2024/0170069 A1 May 23, 2024

Related U.S. Application Data

(60) Provisional application No. 63/426,613, filed on Nov. 18, 2022.

(51) Int. Cl.
*G11C 16/10* (2006.01)
*G01N 3/06* (2006.01)
*G01N 3/12* (2006.01)
*G06F 9/445* (2018.01)

(52) U.S. Cl.
CPC .............. *G11C 16/10* (2013.01); *G01N 3/06* (2013.01); *G01N 3/12* (2013.01); *G06F*

*9/44521* (2013.01); *G01N 2203/0017* (2013.01); *G01N 2203/0411* (2013.01)

(58) Field of Classification Search
CPC . G11C 16/10; G11C 16/0483; G11C 16/3459; G01N 3/06; G01N 3/12; G01N 2203/0017; G01N 2203/0411; G01N 3/04; G06F 9/44521
See application file for complete search history.

(56) References Cited

U.S. PATENT DOCUMENTS

| | | | | |
|---|---|---|---|---|
| 2011/0302476 A1* | 12/2011 | Lee | .................... | G11C 16/3418 714/763 |
| 2013/0088923 A1* | 4/2013 | Kang | .................. | G11C 11/5621 365/185.24 |
| 2018/0158527 A1* | 6/2018 | Confalonieri | .......... | G11C 16/06 |

\* cited by examiner

*Primary Examiner* — Jerome Leboeuf
(74) *Attorney, Agent, or Firm* — Lowenstein Sandler LLP

(57) ABSTRACT

A request to execute a programming operation to program a set of memory cells of the memory array is identified, where the programming operation comprises a set of prologue sub-operations and a set of program sub-operations. A loading process is caused to be executed to load data associated with the programming operation to the memory device. During the loading process, at least a portion of the prologue sub-operations associated with the programming operation are caused to be executed. Following completion of the loading process, the set of program sub-operations of the programming operation are caused to be executed.

20 Claims, 10 Drawing Sheets

| $350_0$ | $350_1$ | $350_2$ | $350_3$ |
|---|---|---|---|
| Block$_0$ 250$_0$ | Block$_0$ 250$_0$ | Block$_0$ 250$_0$ | Block$_0$ 250$_0$ |
| Block$_1$ 250$_1$ | Block$_1$ 250$_1$ | Block$_1$ 250$_1$ | Block$_1$ 250$_1$ |
| Block$_2$ 250$_2$ | Block$_2$ 250$_2$ | Block$_2$ 250$_2$ | Block$_2$ 250$_2$ |
| Block$_3$ 250$_3$ | Block$_3$ 250$_3$ | Block$_3$ 250$_3$ | Block$_3$ 250$_3$ |
| Block$_4$ 250$_4$ | Block$_4$ 250$_4$ | Block$_4$ 250$_4$ | Block$_4$ 250$_4$ |
| ⋮ | ⋮ | ⋮ | ⋮ |
| Block$_{L-4}$ 250$_{L-4}$ | Block$_{L-4}$ 250$_{L-4}$ | Block$_{L-4}$ 250$_{L-4}$ | Block$_{L-4}$ 250$_{L-4}$ |
| Block$_{L-3}$ 250$_{L-3}$ | Block$_{L-3}$ 250$_{L-3}$ | Block$_{L-3}$ 250$_{L-3}$ | Block$_{L-3}$ 250$_{L-3}$ |
| Block$_{L-2}$ 250$_{L-2}$ | Block$_{L-2}$ 250$_{L-2}$ | Block$_{L-2}$ 250$_{L-2}$ | Block$_{L-2}$ 250$_{L-2}$ |
| Block$_{L-1}$ 250$_{L-1}$ | Block$_{L-1}$ 250$_{L-1}$ | Block$_{L-1}$ 250$_{L-1}$ | Block$_{L-1}$ 250$_{L-1}$ |
| Block$_L$ 250$_L$ | Block$_L$ 250$_L$ | Block$_L$ 250$_L$ | Block$_L$ 250$_L$ |
| 240$_0$ | 240$_1$ | 240$_2$ | 240$_3$ |

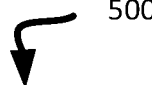

500

Identify a request to execute a programming operation to program a set of memory cells of a memory device, the programming operation including a set of prologue sub-operations and a set of program sub-operations
510

Cause execution of a loading process to load data associated with the programming operation to the memory device
520

Cause, during the loading process, execution of at least a portion of the set of prologue sub-operations associated with the programming operation
530

Following completion of the loading process, cause execution of the set of program sub-operations of the programming operation
540

EXECUTION OF PROLOGUE SUB-OPERATIONS OF A PROGRAMMING OPERATION DURING DATA LOADING

CROSS-REFERENCE TO RELATED APPLICATION

This application claims the benefit of U.S. Provisional Application No. 63/426,613, filed Nov. 18, 2022, the entirety of which is incorporated herein by reference.

TECHNICAL FIELD

Embodiments of the disclosure relate generally to memory sub-systems, and more specifically, relate to executing one or more prologue sub-operations associated with a programming operation during loading of data associated with the programming operation.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 2A-2D are schematics of portions of an array of memory cells as could be used in a memory of the type described with reference to FIG. 1B, in accordance with one or more embodiments of the present disclosure.

FIG. 3 is a block schematic of a portion of an array of memory cells as could be used in a memory of the type described with reference to FIG. 1B, in accordance with one or more embodiments of the present disclosure.

FIG. 5 is a flow diagram of an example method to perform a reduced programming operation where at least a portion of a set of prologue sub-operations are executed during a loading of data associated with the programming operation, in accordance with one or more embodiments of the present disclosure.

DETAILED DESCRIPTION

Figure 1A:
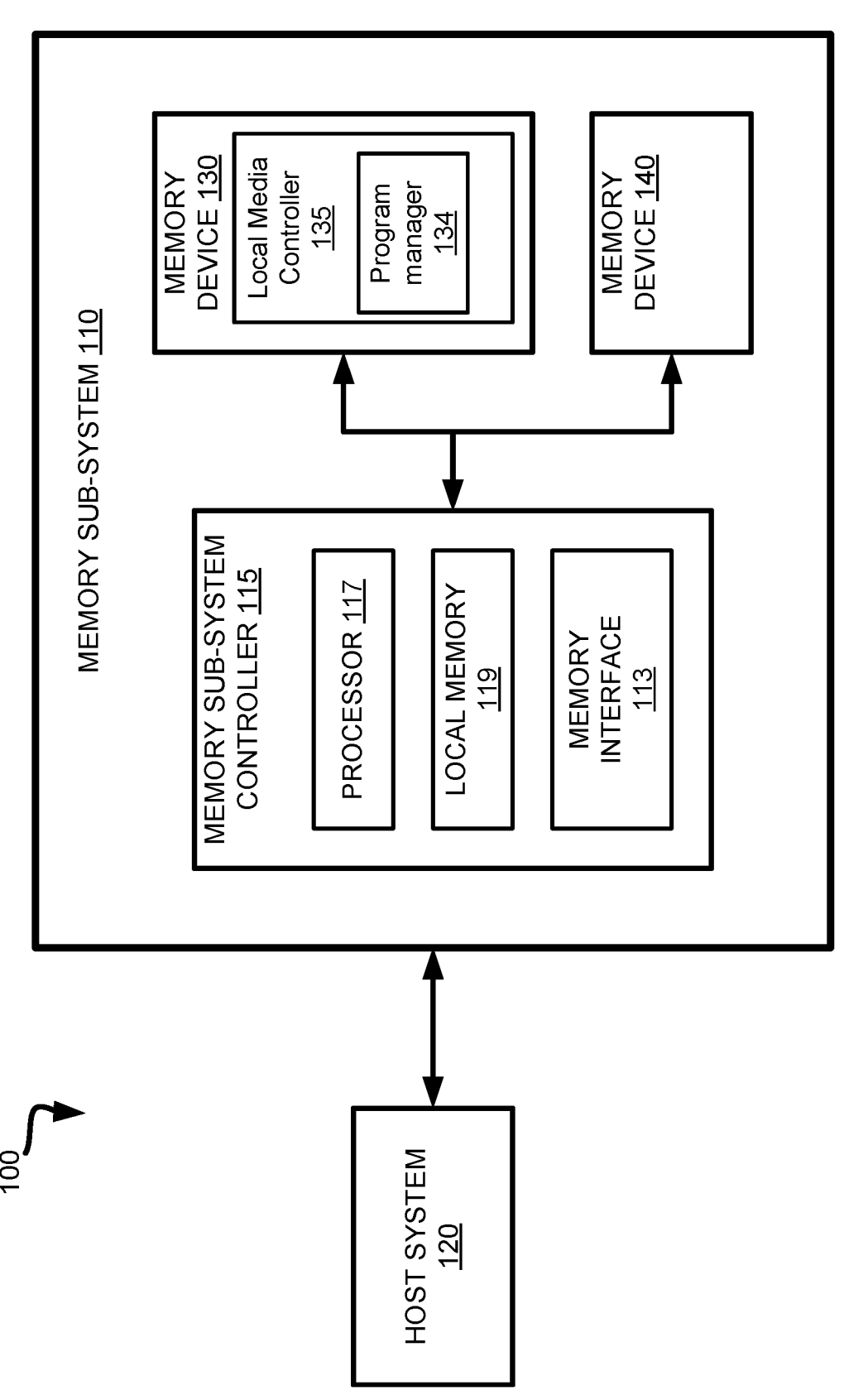
FIG. 1A illustrates an example computing system that includes a memory sub-system, in accordance with one or more embodiments of the present disclosure.

Aspects of the present disclosure are directed to execution of a reduced programming operation where at least a portion of a set of prologue sub-operations are executed during a data loading stage. A memory sub-system can be a storage device, a memory module, or a combination of a storage device and memory module. Examples of storage devices and memory modules are described below in conjunction with FIGS. 1A-1B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a not-and (NAND) memory device. Other examples of non-volatile memory devices are described below in conjunction with FIGS. 1A-1B. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device (e.g., a memory die) can include memory cells arranged in a two-dimensional or a three-dimensional grid. The memory cells are formed onto a silicon wafer in an array of columns and rows. The memory cells are joined by wordlines, which are conducting lines electrically connected to the control gates of the memory cells, and bitlines, which are conducting lines electrically connected to the drain electrodes of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

Some memory devices can be three-dimensional (3D) memory devices (e.g., 3D NAND devices). For example, a 3D memory device can include memory cells that are placed between sets of layers including a pillar (e.g., polysilicon pillar), a tunnel oxide layer, a charge trap (CT) layer, and a dielectric (e.g., oxide) layer. A 3D memory device can have a "top deck" corresponding to a first side and a "bottom deck" corresponding to a second side. Without loss of generality, the first side can be a drain side and the second side can be a source side. For example, a 3D memory device can be a 3D replacement gate memory device having a replacement gate structure using wordline stacking.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage Vt (also referred to as the "threshold voltage") such that the source-drain electric current is low for the control gate voltage ($V_{CG}$) being below the threshold voltage, $V_{CG} < Vt$.

The current increases substantially once the control gate voltage has exceeded the threshold voltage, $V_{CG}>Vt$. Because the actual geometry of the electrodes and gates varies from cell to cell, the threshold voltages can be different even for cells implemented on the same die. The cells can, therefore, be characterized by a distribution P of the threshold voltages, $P(Q,V_T)=dW/dV_T$, where dW represents the probability that any given cell has its threshold voltage within the interval [Vt,Vt+dVt] when charge Q is placed on the cell.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell (1 bit for upper page (UP) data and 1 bit for lower page (LP) data) and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell (1 bit for UP data, 1 bit for LP data and 1 bit for extra page (XP) data) and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell (1 bit for UP data, 1 bit for LP data, 1 bit for XP data, and 1 bit for top page (TP) data) and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits of information for n pages. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

One or more memory access operations can be performed with respect to the memory cells of the memory device. In an illustrative example, a memory cell programming operation, which can be performed in response to receiving a program or write command from the host, can involve sequentially applying programming voltage pulses to a selected or target wordline (WLn). In some implementations, the programming pulse voltage can be sequentially ramped up from the initial voltage value (e.g., 0V) to the final voltage value (e.g., $V_{MAX}$). The unselected wordlines can, during the programming operation, be biased at a certain voltage, e.g., a pass through voltage, which is less than the programming voltage. After each programming pulse, or after a number of programming pulses, a program verify operation can be performed to determine if the threshold voltage of the one or more memory cells has increased to a desired programming level.

Memory access operations (e.g., a program operation, an erase operation, etc.) can be executed with respect to the memory cells by applying a wordline bias voltage to wordlines to which memory cells of a selected page are connected. For example, during a programming operation, one or more selected memory cells can be programmed with data with the application of a programming voltage to a selected wordline. In one approach, an Incremental Step Pulse Programming (ISPP) process or scheme can be employed to maintain a tight cell threshold voltage distribution for higher data reliability. In ISPP, a series of high-amplitude pulses of voltage levels having an increasing magnitude (e.g., successive pulses increasing by a predefined pulse step height) are applied to wordlines to which one or more memory cells are connected to gradually raise the voltage level of the memory cells to above a wordline voltage level corresponding to the memory access operation (e.g., a target program level). The application of the uniformly increasing pulses by a wordline driver of the memory device enables the selected wordline to be ramped or increased to a wordline voltage level ($V_{wl}$) corresponding to a memory access operation. Similarly, a series of voltage pulses having a uniformly increasing voltage level can be applied to the wordline to ramp the wordline to the corresponding wordline voltage level during the execution of an erase operation.

During an initial stage, the data associated with the programming operation is loaded by the memory device. The data loading stage, also referred to as a pre-programming stage, is executed and completed prior to the execution of the programming operation. In certain systems, the data input phase is significant and delays the start of the programming operation. For example, in a multi-plane programming operation (e.g., a six-plane memory device), the data loading time can be approximately 32 µs with an example clocking speed of 3600 MTS. This time can represent approximately 5% of a target programming time (Tprog).

These systems prohibit the programming operation from proceeding during the data loading state. In these systems, initiation of the programming operation is delayed until all of the data associated with the programming operation is loaded into the memory device and the data input is confirmed.

Following completion and confirmation of the input of the data, the programming operation includes a set of prologue or preparatory sub-operations or tasks that are performed prior to the execution of a set of program sub-operations. Example prologue sub-operations include, but are not limited to, a setup sub-operation performed prior to execution of a memory access operation relating to a memory array including all circuit variable initialization, enabling support modules such as temperature sensors, available power checks, page buffer initialization, enabling analog circuits, etc. After the prologue sub-operations are completed, the remaining sub-operations (i.e., program sub-operations) are executed. Example program sub-operations can include the application of a series of programming pulses, program verify sub-operations, a final voltage discharge associated with the completion of the programming operation, all closing activities including closing analog circuits, moving sensed data to a data output buffer, saving critical data into memory, etc. Accordingly, the total programming time (Tprog) includes the cumulative time to execute the prologue sub-operations (Tprologue) and the time to execute the program sub-operations (e.g., program pulses, program verify, discharge). In some systems, the prologue time (Tprologue) can represent approximately 10-11% of the total programming time (Tprog).

Aspects of the present disclosure address the above and other deficiencies by performing at least a portion of the prologue sub-operations during the data loading stage associated with a programming operation. According to embodiments, in response to a request to execute a programming operation to program a set of memory cells of a memory device, a data loading stage is executed to load data to be programmed into the target memory cells. According to embodiments, during the data loading stage, at least a portion of the prologue sub-operations of the programming operation are executed. Advantageously, by executing at least a portion of the prologue sub-operations concurrently with the data input stage results in a reduction of the total programming time. The resulting reduction of the total programming time improves the system program performance and overall quality of service metrics.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DINM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a not-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory page buffers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The local media controllers 135 can implement a program manager 134 that can cause execution of one or more prologue sub-operations of a programming operation during loading of data to the one or more memory devices 130. In an embodiment, as a result of executing at least a portion of the prologue sub-operations concurrently with the data loading state, following the data loading, the program manager 134 executes the reduced programming operation by identifying and skipping execution of the previously executed prologue operations. Accordingly, the program manager 134 causes execution of any remaining (i.e., not yet executed) prologue sub-operations and the set of program sub-operations (e.g., program pulses, program verify sub-operations, discharge sub-operations, etc.) to complete the programming of the target memory cells. Advantageously, the program manager 134 performs the reduced programming algorithm including at least a portion of the prologue sub-operations during the data loading stage to reduce the total programming time corresponding to the requested programming operation. For example, a total programming time (Tprog) can be reduced by an amount of a time associated with execution of at least a portion of the prologue sub-operations during the data loading stage.

Figure 1B:
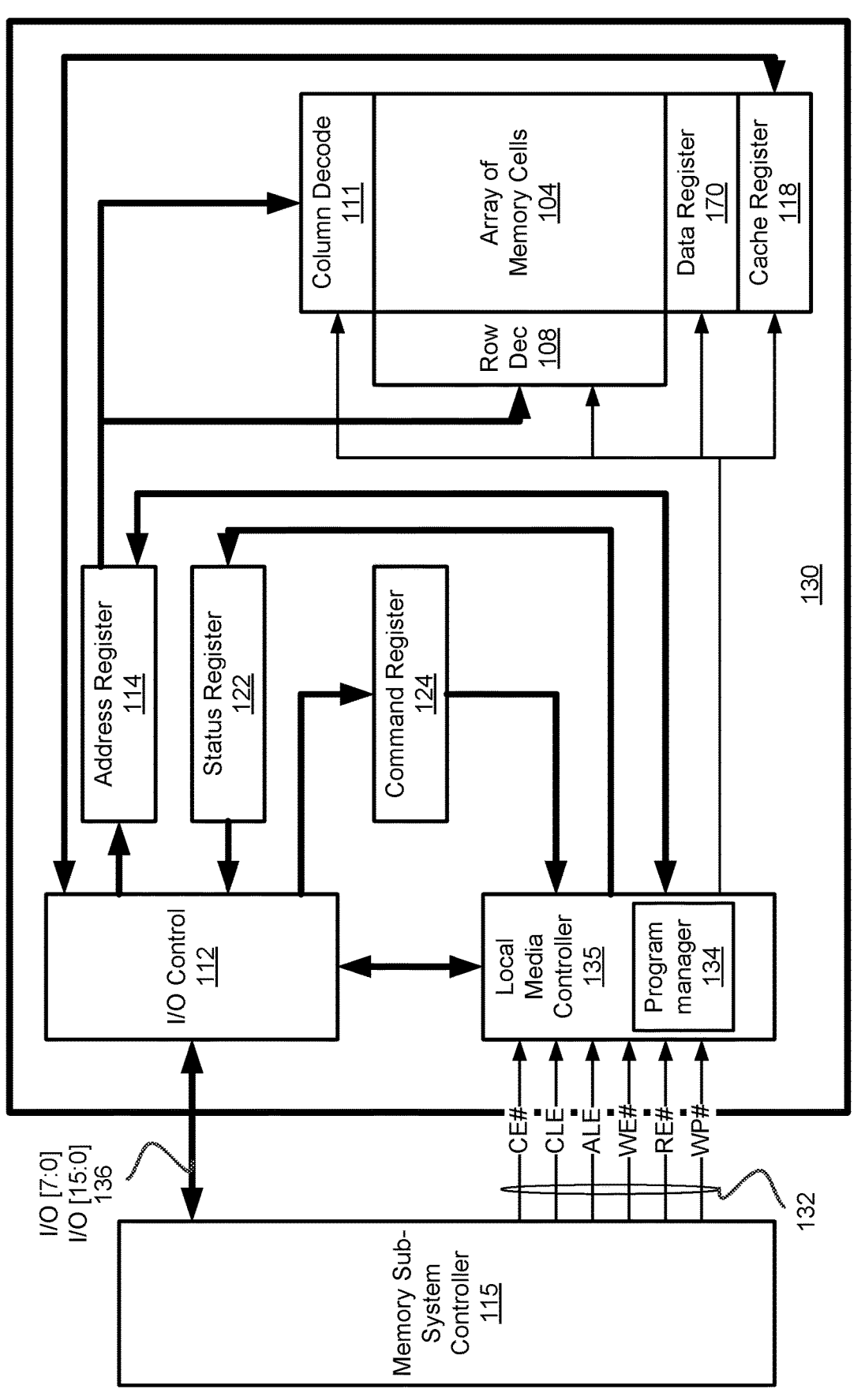
FIG. 1B is a block diagram of a memory device in communication with a memory sub-system controller of a memory sub-system, in accordance with one or more embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are connected to the same access line (e.g., a wordline) while memory cells of a logical column are selectively connected to the same data line (e.g., a bitline). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 111 are provided to decode address signals. Address signals are received and decoded to access the array of memory cells 104. Memory device 130 also includes input/output (I/O) control circuitry 112 to manage input of commands, addresses and data to the memory device 130 as well as output of data and status information from the memory device 130. An address register 114 is in communication with I/O control circuitry 112 and row decode circuitry 108 and column decode circuitry 111 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses. In one embodiment, local media controller 135 includes the program manager 134, which can implement the execution of at least a portion of the prologue sub-operations of a programming operation during a data loading stage to reduce a total programming time associated with the programming operation of a set of target memory cells of the memory device 130.

The local media controller 135 is also in communication with a cache register (or cache buffer) 118. Cache register 118 latches data, either incoming or outgoing, as directed by the local media controller 135 to temporarily store data while the array of memory cells 104 is busy writing or reading, respectively, other data. During a program operation (e.g., write operation), data may be passed from the cache register 118 to the data register 170 for transfer to the array of memory cells 104; then new data may be latched in the cache register 118 from the I/O control circuitry 112. During a read operation, data may be passed from the cache register 118 to the I/O control circuitry 112 for output to the memory sub-system controller 115; then new data may be passed from the data register (or data buffer) 170 to the cache register 118. The cache register 118 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 112 and the local media controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 136 and outputs data to the memory sub-system controller 115 over I/O bus 136.

For example, the commands may be received over input/output (I/O) pins [7:0] of I/O bus 136 at I/O control circuitry 112 and may then be written into command register 124. The addresses may be received over input/output (I/O) pins [7:0] of I/O bus 136 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data page buffer 170 for programming the array of memory cells 104.

In an embodiment, cache register 118 may be omitted, and the data may be written directly into data page buffer 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIGS. 1A-1B has been simplified. It should be recognized that the functionality of the various block components described with reference to FIGS. 1A-1B may not necessarily be segregated to distinct components or component portions of an integrated circuit device. For example, a single component or component portion of an integrated circuit device could be adapted to perform the functionality of more than one block component of FIGS. 1A-1B. Alternatively, one or more components or component portions of an integrated circuit device could be combined to perform the functionality of a single block component of FIGS. 1A-1B. Additionally, while specific I/O pins are described in accordance with popular conventions for receipt and output of the various signals, it is noted that other combinations or numbers of I/O pins (or other I/O node structures) may be used in the various embodiments.

Figure 2A:
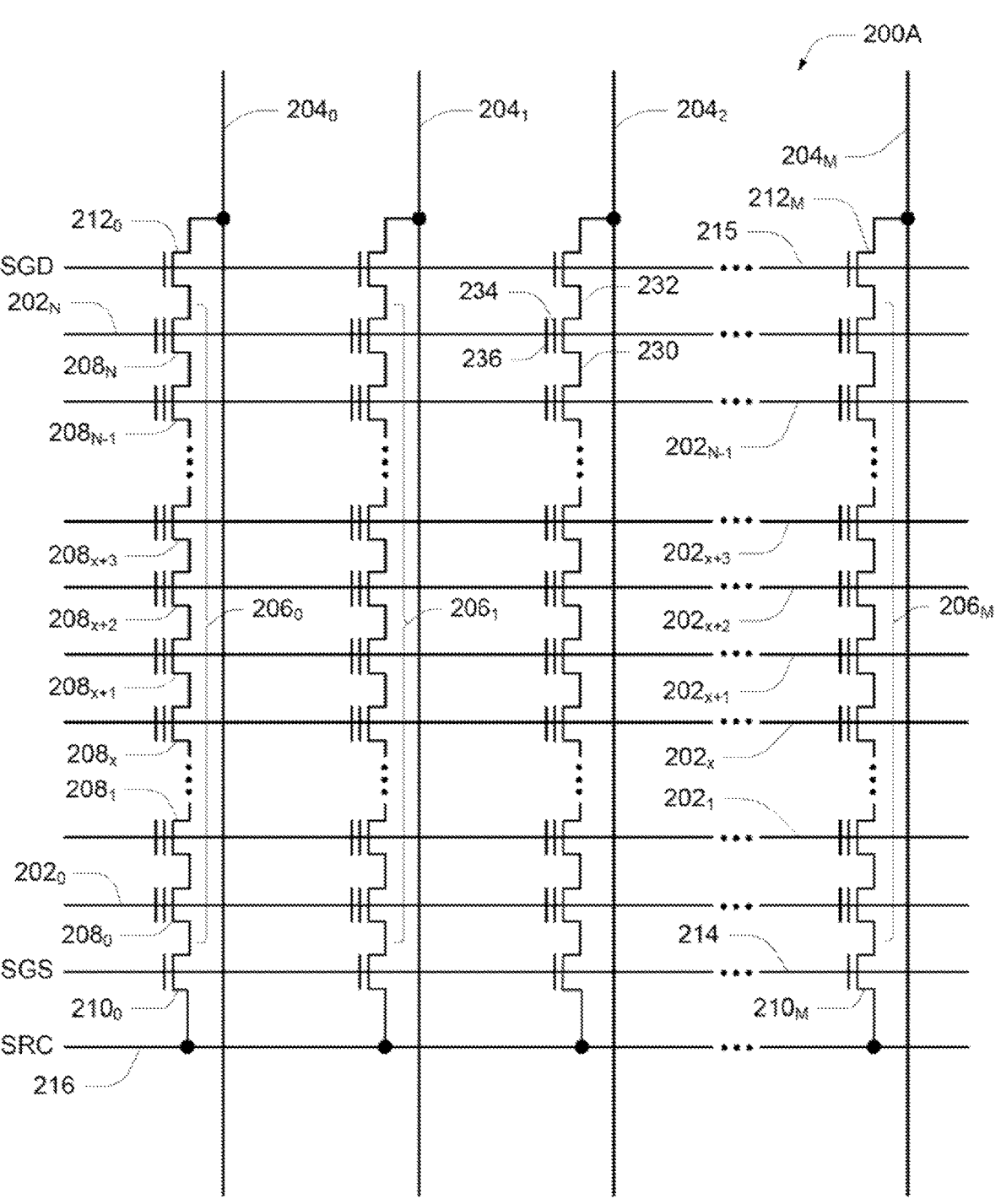
Figure 2B:
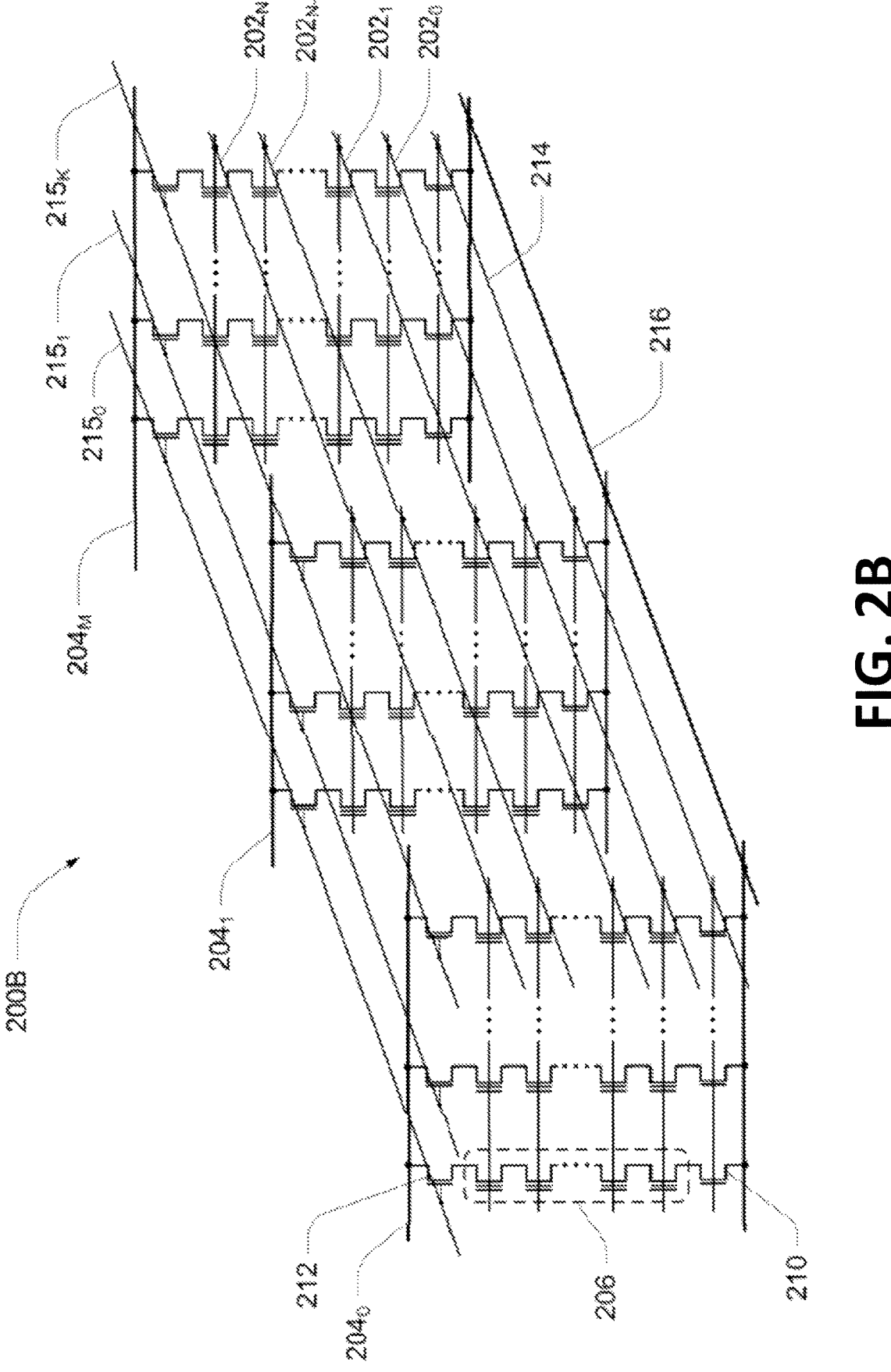
Figure 2C:
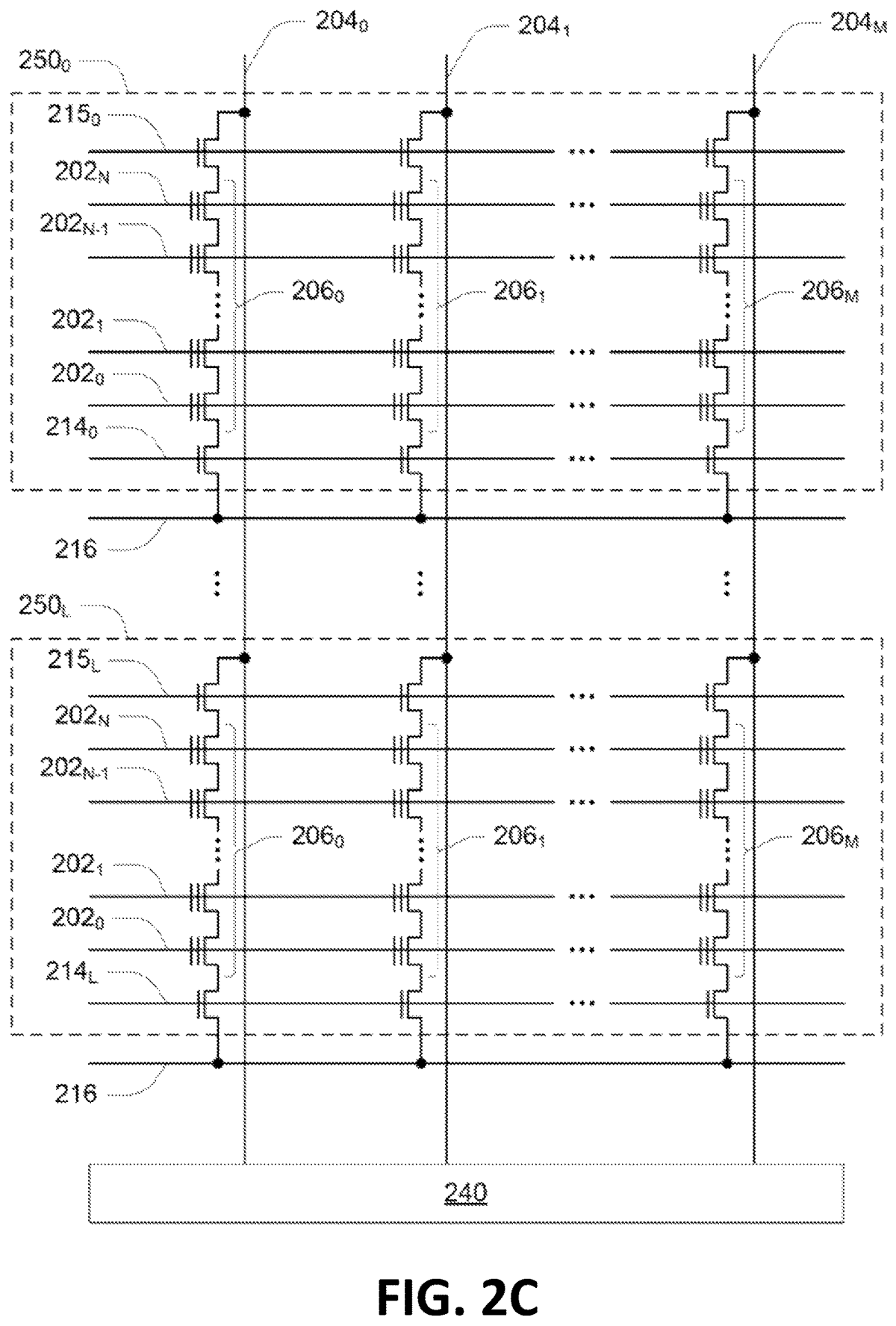

FIGS. 2A-2C are diagrams of portions of an example array of memory cells included in a memory device, in accordance with some embodiments of the present disclosure. For example, FIG. 2A is a schematic of a portion of an array of memory cells 200A as could be used in a memory device (e.g., as a portion of array of memory cells 104). Memory array 200A includes access lines, such as wordlines $202_0$ to $202_N$, and a data line, such as bitline 204. The wordlines 202 may be connected to global access lines (e.g., global wordlines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A can be arranged in rows each corresponding to a respective wordline 202 and columns each corresponding to a respective bitline 204. Rows of memory cells 208 can be divided into one or more groups of physical pages of memory cells 208, and physical pages of memory cells 208 can include every other memory cell 208 commonly connected to a given wordline 202. For example, memory cells 208 commonly connected to wordline $202_N$ and selectively connected to even bitlines 204 (e.g., bitlines $204_0$, $204_2$, $204_4$, etc.) may be one physical page of memory cells 208 (e.g., even memory cells) while memory cells 208 commonly connected to wordline $202_N$ and selectively connected to odd bitlines 204 (e.g., bitlines $204_1$, $204_3$, $204_5$, etc.) may be another physical page of memory cells 208 (e.g., odd memory cells). Although bitlines $204_3$-$204_5$ are not explicitly depicted in FIG. 2A, it is apparent from the figure that the bitlines 204 of the array of memory cells 200A may be numbered consecutively from bitline $204_0$ to bitline $204_M$. Other groupings of memory cells 208 commonly connected to a given wordline 202 may also define a physical page of memory cells 208. For certain memory devices, all memory cells commonly connected to a given wordline might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to wordlines $202_0$-$202_N$ (e.g., all strings 206 sharing common wordlines 202). Unless expressly distinguished, a reference to a page of memory cells herein refers to the memory cells of a logical page of memory cells.

Each column can include a string of series-connected memory cells (e.g., non-volatile memory cells), such as one of strings $206_0$ to $206_M$. Each string 206 can be connected (e.g., selectively connected) to a source line 216 (SRC) and can include memory cells $208_0$ to $208_N$. The memory cells 208 of each string 206 can be connected in series between a select gate 210, such as one of the select gates $210_0$ to $210_M$, and a select gate 212, such as one of the select gates $212_0$ to $212_M$. In some embodiments, the select gates $210_0$ to $210_M$ are source-side select gates (SGS) and the select gates $212_0$ to $212_M$ are drain-side select gates. Select gates $210_0$ to $210_M$ can be connected to a select line 214 (e.g., source-side select line) and select gates $212_0$ to $212_M$ can be connected to a select line 215 (e.g., drain-side select line). The select gates 210 and 212 might represent a plurality of select gates connected in series, with each select gate in series configured to receive a same or independent control signal. A source of each select gate 210 can be connected to SRC 216, and a drain of each select gate 210 can be connected to a memory cell $208_0$ of the corresponding string 206. Therefore, each select gate 210 can be configured to selectively connect a corresponding string 206 to SRC 216. A control gate of each select gate 210 can be connected to select line 214. The drain of each select gate 212 can be connected to the bitline 204 for the corresponding string 206. The source of each select gate 212 can be connected to a memory cell $208_N$ of the corresponding string 206. Therefore, each select gate 212 might be configured to selectively connect a corresponding string 206 to the bitline 204. A control gate of each select gate 212 can be connected to select line 215.

In some embodiments, and as will be described in further detail below with reference to FIG. 2B, the memory array in FIG. 2A is a three-dimensional memory array, in which the strings 206 extend substantially perpendicular to a plane containing SRC 216 and to a plane containing a plurality of bitlines 204 that can be substantially parallel to the plane containing SRC 216.

FIG. 2B is another schematic of a portion of an array of memory cells 200B (e.g., a portion of the array of memory cells 104) arranged in a three-dimensional memory array structure. The three-dimensional memory array 200B may incorporate vertical structures which may include semiconductor pillars where a portion of a pillar may act as a channel region of the memory cells of strings 206. The strings 206 may be each selectively connected to a bit line $204_0$-$204_M$ by a select gate 212 and to the SRC 216 by a select gate 210. Multiple strings 206 can be selectively connected to the same bitline 204. Subsets of strings 206 can be connected to their respective bitlines 204 by biasing the select lines $215_0$-$215_L$ to selectively activate particular select gates 212 each between a string 206 and a bitline 204. The select gates 210 can be activated by biasing the select line 214. Each wordline 202 may be connected to multiple rows of memory cells of the memory array 200B. Rows of memory cells that are commonly connected to each other by a particular wordline 202 may collectively be referred to as tiers.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250o$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bitlines $204_0$-$204_M$ can be connected (e.g., selectively connected) to a buffer portion 240, which can be a portion of the page buffer 152 of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bitlines 204.

Figure 2D:
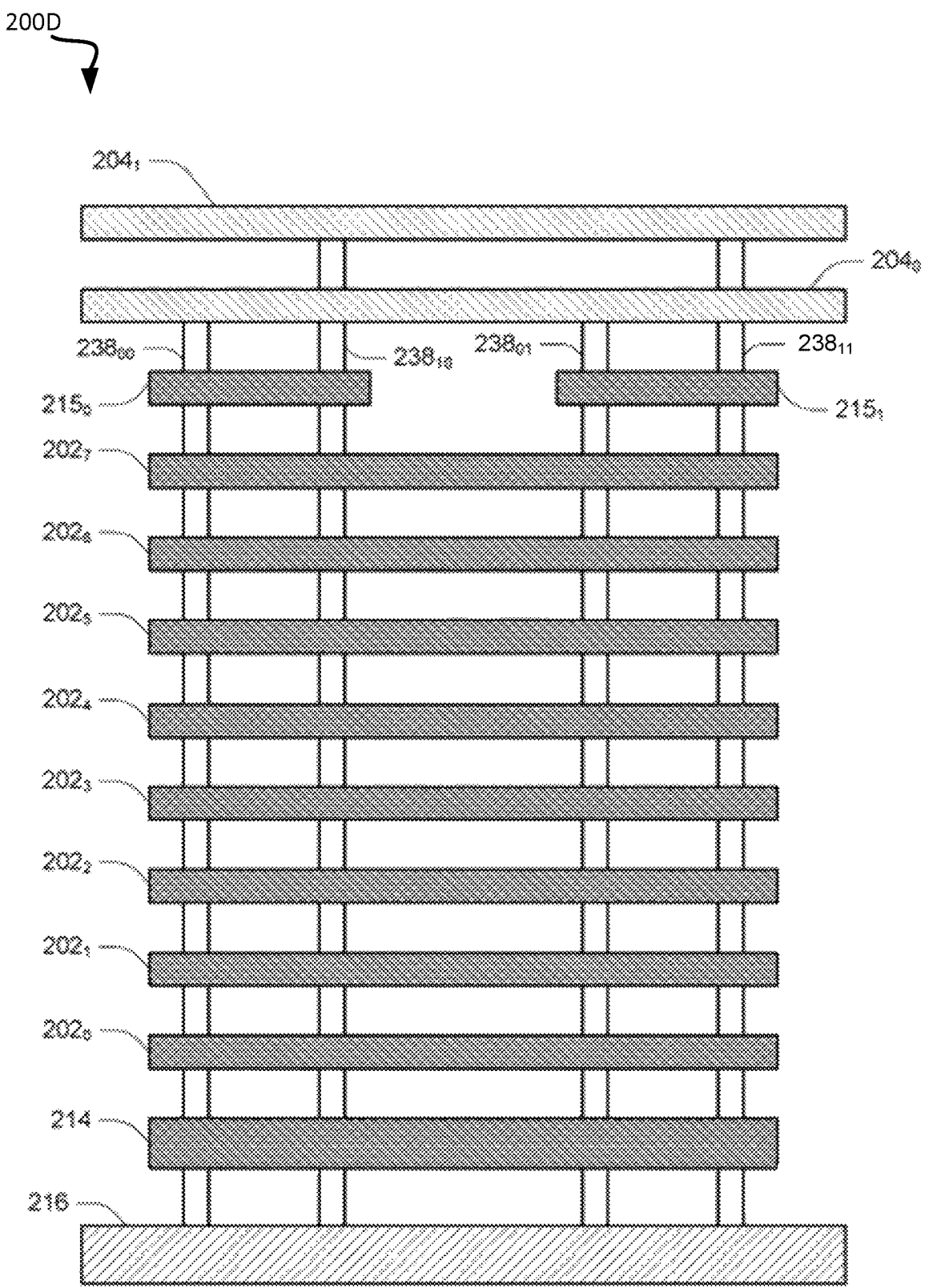

FIG. 2D is a diagram of a portion of an array of memory cells 200D (e.g., a portion of the array of memory cells 104). Channel regions (e.g., semiconductor pillars) $238_{00}$ and $238_{01}$ represent the channel regions of different strings of series-connected memory cells (e.g., strings 206 of FIGS. 2A-2C) selectively connected to the bitline $204_0$. Similarly, channel regions 23810 and 23811 represent the channel regions of different strings of series-connected memory cells (e.g., NAND strings 206 of FIGS. 2A-2C) selectively connected to the bitline $204_1$. A memory cell (not depicted in FIG. 2D) may be formed at each intersection of an wordline 202 and a channel region 238, and the memory cells corresponding to a single channel region 238 may collectively form a string of series-connected memory cells (e.g., a string 206 of FIGS. 2A-2C). Additional features might be common in such structures, such as dummy wordlines, segmented channel regions with interposed conductive regions, etc.

FIG. 3 is a block schematic of an example reduced programming operation portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

Figure 4:
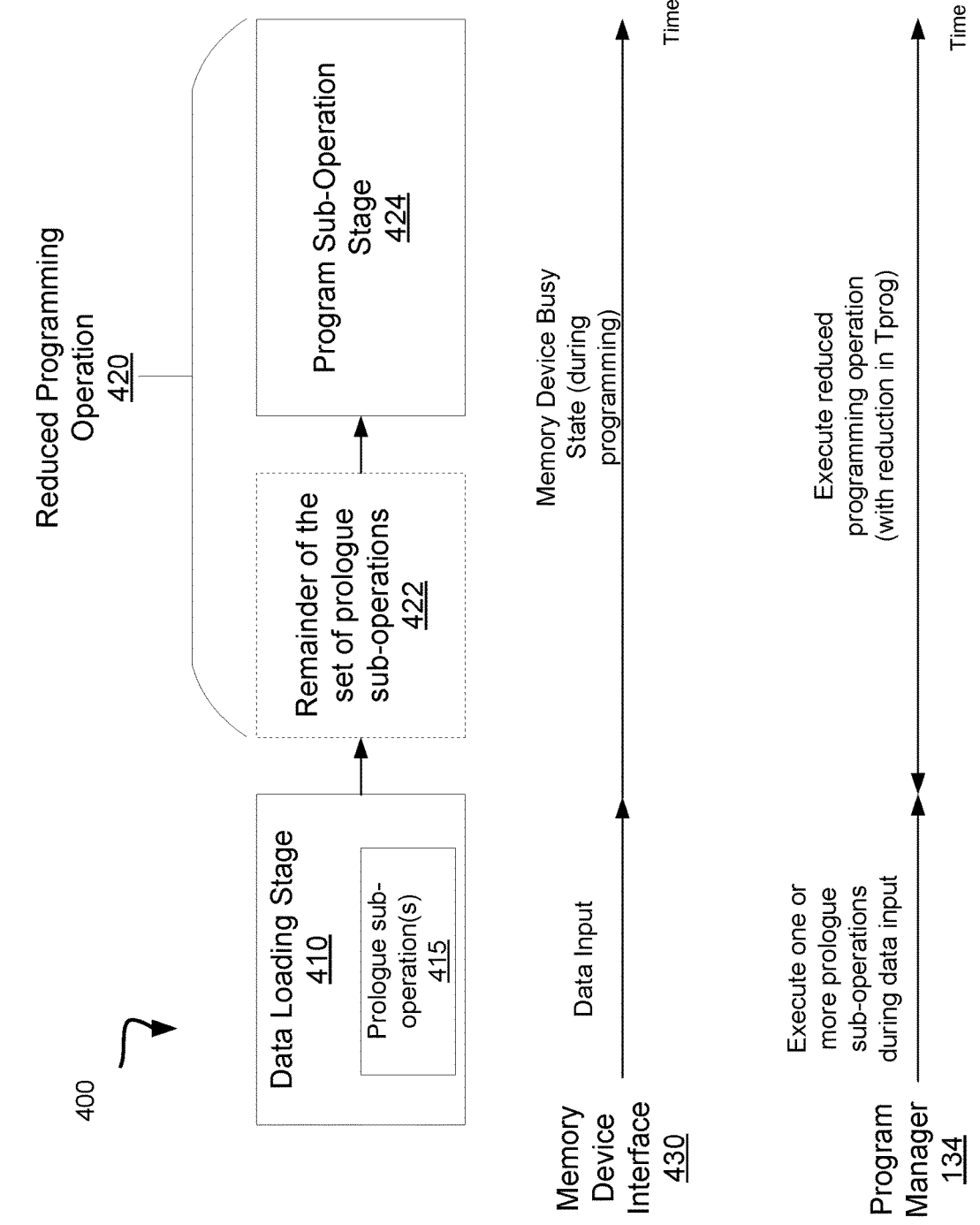
FIG. 4 illustrates example stages associated with execution of a reduced programming operation, in accordance with one or more embodiments of the present disclosure.

FIG. 4 illustrates example stages 400 associated with execution of a reduced programming operation, according to embodiments of the present disclosure. As shown in the example 400, a request to execute a programming operation to program a set of target memory cells of a memory device is identified. In response to the programming operation request, a data loading stage 410 is performed to load data associated with the programming operation into the memory device. In an embodiment, during the data loading stage 410, at least a portion of a set of prologue sub-operations 415 associated with the programming operation are performed. For example, the set of prologue sub-operations can include variable initialization, temperature sensor initialization, page buffer initialization, etc.

In an embodiment, upon completion of the data loading stage 410, the reduced programming operation 420 is executed. In an embodiment, if any of the set of prologue operations remain unexecuted, the reduced programming operation 420 includes execution of the remaining portion of the set of program prologue operations 422. In an embodiment, following execution of the remainder of the set of prologue sub-operations 422, a set of program sub-operations are executed during a program sub-operation stage 424 to complete the programming of the target memory cells of the memory device. For example, the set of program sub-operations can include application of one or more programming pulses, execution of one or more program verify sub-operations, a final voltage discharge associated with the target memory cells, etc. Advantageously, the reduced programming operation 420 includes the execution of a remainder of the set of prologue sub-operations 422 (i.e., any prologue sub-operations that were not executed during the data loading stage 410) and execution of the set of program sub-operations during the program sub-operation stage 424.

In an embodiment, the entire set of prologue sub-operations 415 are executed during the data loading stage 410. In this embodiment, there are no remaining prologue sub-operations, and execution of the reduced programming operation 420 includes execution of the set of program sub-operations during the program sub-operation stage 424.

As shown in FIG. 4, during the data loading stage 410, the memory device interface 430 is utilized for the loading of the data (i.e., the data received from a host system for the requested programming operation) into the memory device (e.g., memory device 130 of FIG. 1A, FIG. 1B). In an embodiment, following completion of the data input, the memory device interface 430 enters a memory device busy state during the execution and completion of the reduced programming operation 420.

As shown in FIG. 4, during the data loading stage 410, the program manager 134 executes one or more of the set of prologue sub-operations. In an embodiment, the program manager 134 identifies the prologue sub-operations that have been completed during the data loading stage 410. The identified prologue sub-operations are skipped or excluded from execution during the reduced programming operation. Accordingly, as shown in FIG. 4, following the data loading stage, the program manager 134 executes the reduced programming operation including a remainder of the set of prologue sub-operations (i.e., the prologue sub-operations that were not executed during the data loading stage 410) and the set of program sub-operations (e.g., program pulses, program verify sub-operations, voltage discharge sub-operations). Advantageously, since at least a portion of the prologue sub-operations are executed during the loading stage, the overall programming time (Tprog) is reduced by an amount of time associated with executing those prologue sub-operations during data loading (i.e., the programming time (Tprog) reduction illustrated in FIG. 4). This reduction of the programming time results in an improvement in the system's program performance and overall quality of service.

FIG. 5 is a flow diagram of an example method 500 to perform a reduced program operation algorithm (e.g., a programming operation where at least a portion of a set of prologue sub-operations are performed during a data loading stage), in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the program manager 134 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, an operation is requested. For example, processing logic (e.g., the program manager 134 of FIGS. 1A-1B) can identify a request to execute a programming operation to program a set of memory cells of a memory device, where the program operation includes a set of prologue sub-operations and a set of program sub-operations. The programming operation can be identified in response to a request received by a memory sub-system controller (e.g., the memory sub-system controller 115 of FIGS. 1A-1B) from a host system. In an embodiment, the host system provides the data corresponding to the requested programming operation.

At operation 520, a process is executed. For example, the processing logic can cause execution of a loading process to load data associated with the programming operation to the memory device. In an embodiment, the data can be loaded or input into the one or more memory devices using an interface associated with one or more memory devices.

At operation 530, one or more sub-operations are executed. For example, the processing logic can cause, during the loading process, execution of at least a portion of the set of prologue sub-operations associated with the programming operation. In an embodiment, the set of prologue sub-operations can include a variable initialization, a temperature sensor initialization, a page buffer initialization, etc. associated with the programming operation. In an embodiment, all of the prologue sub-operations or a portion of prologue sub-operations can be executed and completed during the loading process. In an embodiment, at the completion of the loading of the data associated with the programming operation, the processing logic can identify the one or more prologue sub-operations that were fully executed and completed during the data loading stage.

At operation 540, a set of sub-operations is executed. For example, following completion of the loading process, the processing logic can cause execution of the set of program sub-operations of the programming operation. In an embodiment, the processing logic can also cause execution of a remainder of the set of prologue sub-operations (i.e., any prologue sub-operations that were not executed and completed during the loading process in operation 530). In an embodiment, the processing logic causes a sensing of a voltage level associated with the set of memory cells to confirm completion of the programming operation.

In an embodiment, an overall programming time (Tprog) associated with the programming operation is reduced by an amount of time corresponding to the execution of the one or more prologue sub-operations in operation 530. Accordingly, an advantageous reduction in the total Tprog is achieved by executing at least a portion of the prologue sub-operations during the data input or loading process.

According to embodiments, the processing logic can determine if an unexpected interruption event occurs during the data loading process (e.g., an interruption of operation 520). In response, the processing logic can reset all enabled circuits during the prologue sub-operation and, proceed with a non-reduced algorithm during tPROG.

Figure 6:
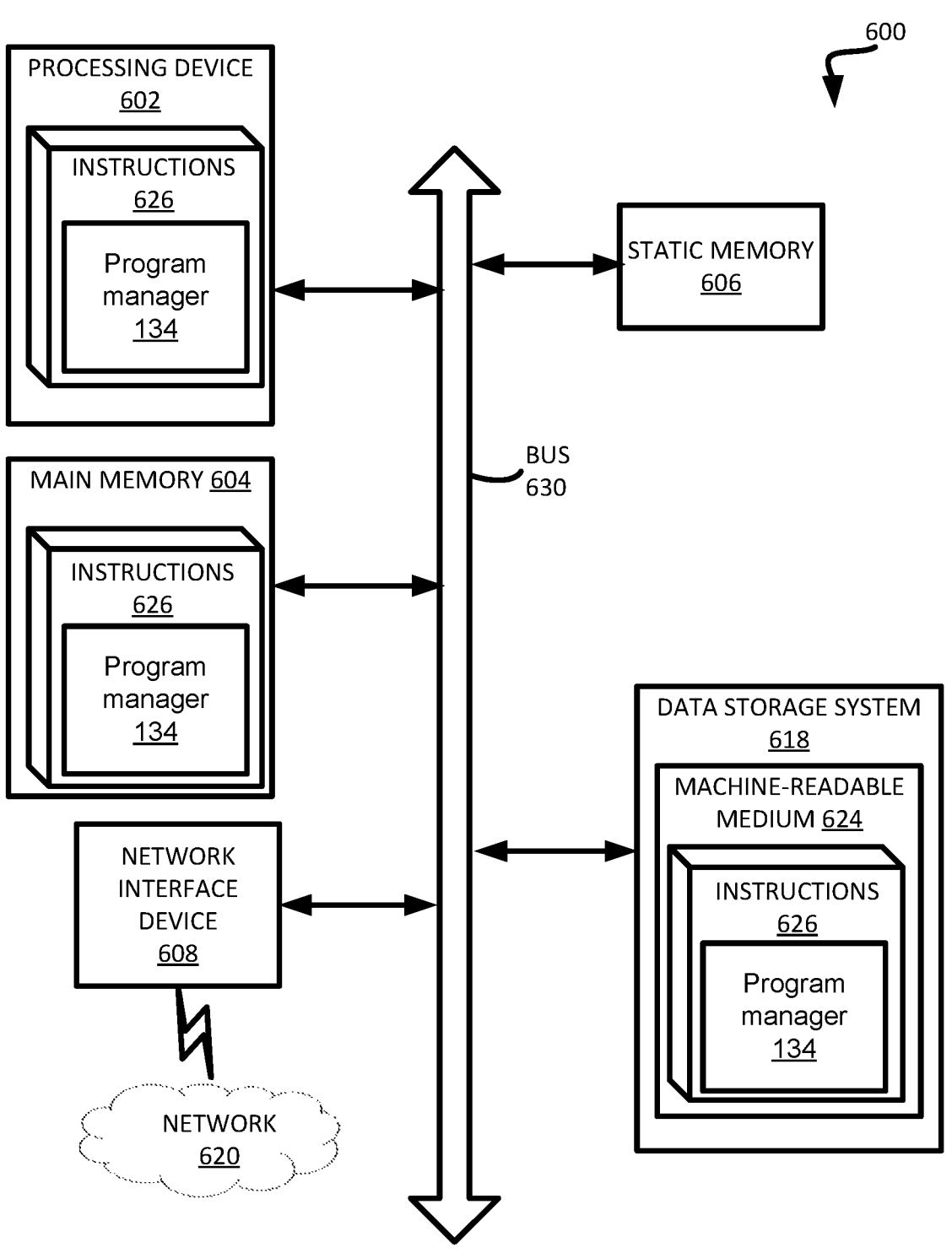
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the program manager 134 of FIG. 1A and FIG. 1B). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1A.

In one embodiment, the instructions 626 include instructions to implement functionality corresponding to a program manager (e.g., the program manager 134 of FIG. 1A and FIG. 1B). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's page buffers and memories into other data similarly represented as physical quantities within the computer system memories or page buffers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
 a memory array; and
 control logic, operatively coupled with the memory array, to perform operations comprising:
  identifying a request to execute a programming operation to program a set of memory cells of the memory array, wherein the programming operation comprises a set of prologue sub-operations and a set of program sub-operations;
  causing execution of a loading process to load data associated with the programming operation to the memory device;
  causing execution of at least a portion of the set of prologue sub-operations associated with the programming operation, wherein the at least the portion of the set of prologue sub-operations and the loading process are executed concurrently; and
  following completion of the loading process, causing execution of the set of program sub-operations of the programming operation.

2. The memory device of claim 1, wherein the at least the portion of the set of prologue sub-operations executed during the loading process comprises a first portion of the set of prologue sub-operations.

3. The memory device of claim 2, the operations further comprising:
 following completion of the loading process, causing execution of a second portion of the set of prologue sub-operations.

4. The memory device of claim 2, the operations further comprising:
 identifying the first portion of the set of prologue sub-operations executed during the loading process; and
 based on the identifying, determining a remaining portion of the set of prologue sub-operations; and following completion of the loading process, causing execution of the remaining portion of the set of prologue sub-operations prior to causing execution of the set of program sub-operations.

5. The memory device of claim 1, the operations further comprising:
 sensing a voltage level associated with the set of memory cells to confirm completion of the programming operation.

6. The memory device of claim 1, wherein the set of prologue sub-operations comprises one or more of a variable initialization sub-operation, a temperature sensor initialization sub-operation, or a page buffer initialization sub-operation.

7. The memory device of claim 1, wherein the set of program sub-operations comprises one or more of applying one or more programming pulses, one or more program verify sub-operations, or a voltage discharge sub-operation.

8. A method comprising:
 identifying, by a processing device, a request to execute a programming operation to program a set of memory cells of a memory device, wherein the programming operation comprises a set of prologue sub-operations and a set of program sub-operations;
 causing execution of a loading process to load data associated with the programming operation to the memory device;
 causing execution of at least a portion of the set of prologue sub-operations associated with the programming operation, wherein the at least the portion of the set of prologue sub-operations and the loading process are executed concurrently; and
 following completion of the loading process, causing execution of the set of program sub-operations of the programming operation.

9. The method of claim 8, wherein the at least the portion of the set of prologue sub-operations executed during the loading process comprises a first portion of the set of prologue sub-operations.

10. The method of claim 9, further comprising following completion of the loading process, causing execution of a second portion of the set of prologue sub-operations.

11. The method of claim 9, further comprising:
 identifying the first portion of the set of prologue sub-operations executed during the loading process;
 based on the identifying, determining a remaining portion of the set of prologue sub-operations; and
 following completion of the loading process, causing execution of the remaining portion of the set of prologue sub-operations prior to causing execution of the set of program sub-operations.

12. The method of claim 11, further comprising sensing a voltage level associated with the set of memory cells to confirm completion of the programming operation.

13. The method of claim 8, wherein the set of prologue sub-operations comprises one or more of a variable initialization sub-operation, a temperature sensor initialization sub-operation, or a page buffer initialization sub-operation.

14. The method of claim 8, wherein the set of program sub-operations comprises one or more of applying one or more programming pulses, one or more program verify sub-operations, or a voltage discharge sub-operation.

15. A non-transitory computer-readable storage medium comprising instructions that, when executed by a processing device, cause the processing device to perform operations comprising:

identifying a request to execute a programming operation to program a set of memory cells of a memory device, wherein the programming operation comprises a set of prologue sub-operations and a set of program sub-operations;

causing execution of a loading process to load data associated with the programming operation to the memory device;

causing execution of at least a portion of the set of prologue sub-operations associated with the programming operation, wherein the at least the portion of the set of prologue sub-operations and the loading process are executed concurrently; and following completion of the loading process, causing execution of the set of program sub-operations of the programming operation.

16. The non-transitory computer-readable storage medium of claim 15, the operations further comprising sensing a voltage level associated with the set of memory cells to confirm completion of the programming operation.

17. The non-transitory computer-readable storage medium of claim 15, wherein the at least the portion of the set of prologue sub-operations executed during the loading process comprises a first portion of the set of prologue sub-operations.

18. The non-transitory computer-readable storage medium of claim 17, the operations further comprising following completion of the loading process, causing execution of a second portion of the set of prologue sub-operations.

19. The non-transitory computer-readable storage medium of claim 17, the operations further comprising:

identifying the first portion of the set of prologue sub-operations executed during the loading process;

based on the identifying, determining a remaining portion of the set of prologue sub-operations; and following completion of the loading process, causing execution of the remaining portion of the set of prologue sub-operations prior to causing execution of the set of program sub-operations.

20. The non-transitory computer-readable storage medium of claim 15, wherein the set of prologue sub-operations comprises one or more of a variable initialization sub-operation, a temperature sensor initialization sub-operation, or a page buffer initialization sub-operation; and wherein the set of program sub-operations comprises one or more of applying one or more programming pulses, one or more program verify sub-operations, or a voltage discharge sub-operation.

* * * * *